United States Patent [19]

Ferrell

[11] Patent Number: 5,505,785
[45] Date of Patent: Apr. 9, 1996

[54] METHOD AND APPARATUS FOR CLEANING INTEGRATED CIRCUIT WAFERS

[76] Inventor: Gary W. Ferrell, 608 Terrace Ave., Half Moon Bay, Calif. 94019

[21] Appl. No.: 276,202

[22] Filed: Jul. 18, 1994

[51] Int. Cl.$^6$ ........................................................ B08B 3/12
[52] U.S. Cl. ................................................ 134/1; 134/201
[58] Field of Search ............................... 134/1, 2, 3, 201, 134/184

[56] References Cited

U.S. PATENT DOCUMENTS

| | | | |
|---|---|---|---|
| 4,543,130 | 9/1985 | Shwartzman | 134/1 |
| 4,804,007 | 2/1989 | Bran | 134/201 |
| 5,037,481 | 8/1991 | Bran | 134/1 |
| 5,100,476 | 3/1992 | Mase et al. | 134/1 |
| 5,114,494 | 5/1992 | Remec | 134/1 |

Primary Examiner—Scott Kastler
Attorney, Agent, or Firm—Francis G. Rushford

[57] ABSTRACT

A method and apparatus for removing particle, metallic and organic contamination from the wafers used in fabricating integrated circuits is disclosed. In the preferred embodiment, the method comprises the step of placing the wafers to be processed in a vessel or container constructed of a very pure metal, and upon which a surface oxide will quickly form in air. The metal vessel or container is then filled with a cleaning solvent such as sulfuric acid, and are ultrasonically vibrated to remove the contamination. The ultrasonic vibration causes an acoustic streaming of the sulfuric acid, leading to a microflow of the solvent across the surface of the wafer at speeds on the order of several meters per second. This microflow provides for an quick and efficient cleaning of the wafer at reduced temperatures, thereby increasing the overall throughput of the planar fabrication process. The apparatus comprises a vessel or container constructed from a very pure metal, and containing an acidic cleaning solvent. The metal vessel or container is coupled to an ultrasonic vibrating device which ultrasonically vibrates the vessel or container, thereby cleaning the wafers.

21 Claims, 6 Drawing Sheets

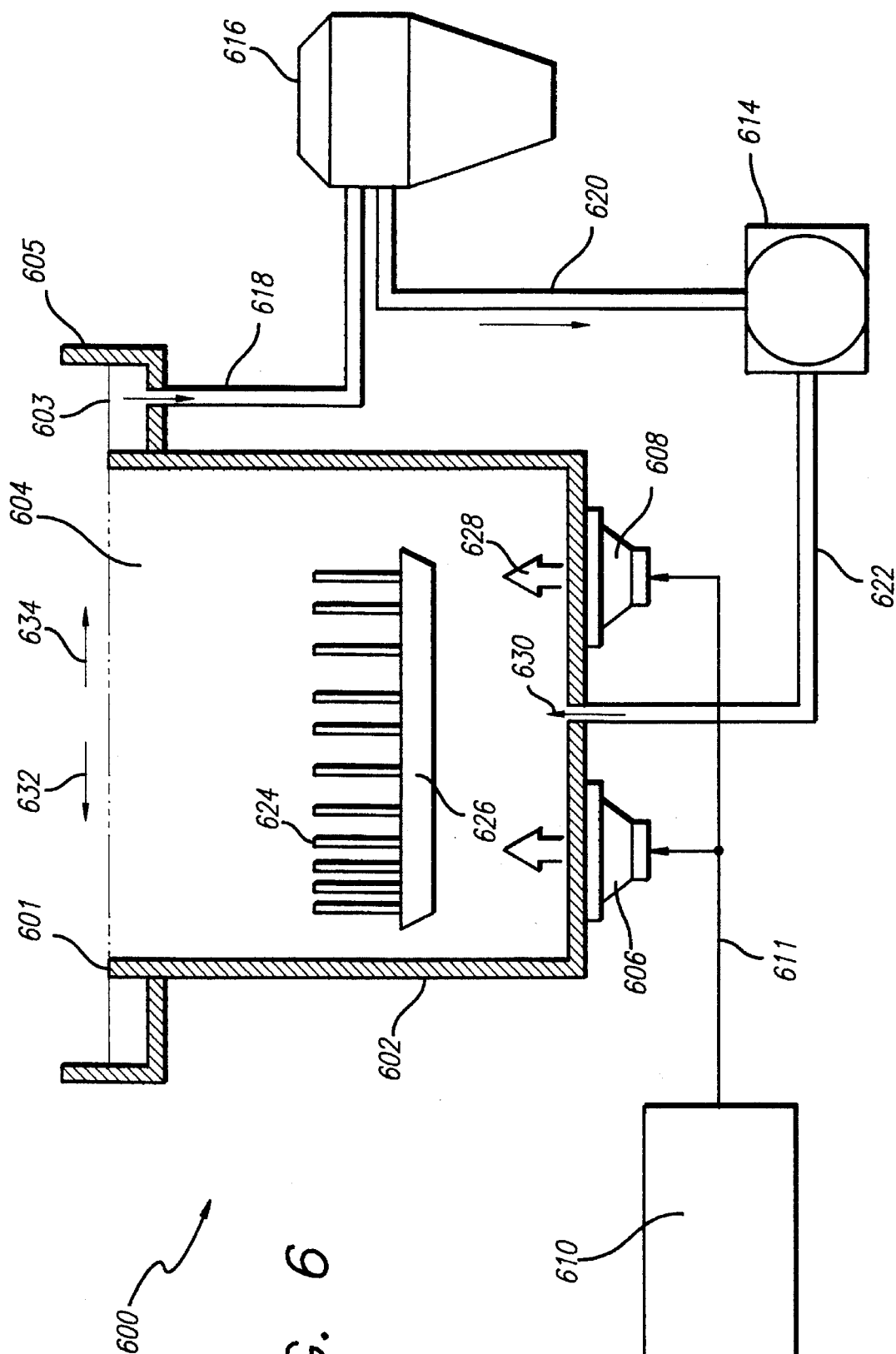

METHOD AND APPARATUS FOR CLEANING INTEGRATED CIRCUIT WAFERS

BACKGROUND OF THE INVENTION

1. Field of the Invention

The present invention relates to the fabrication of integrated circuits, and more particularly to a cleaning process and system which substantially reduces the metallic, particle and organic contamination of integrated circuit wafers during planar processing.

2. Description of the Prior Art

For the past 25 years, a huge research and development effort has been directed to the production of integrated circuits. Much of this effort has been directed to the development of the planar process, in which integrated circuit devices are produced using a sequence of steps carried out on the surface of a semiconductor wafer. More particularly, the planar process involves the proper sequencing and repetition of the steps of oxidation, patterning, dopant-addition and dopant diffusion, which results in the selective introduction of p- and n-type dopant atoms into specific regions on the surface of the wafer. The introduction of the dopant atoms into specific regions of the wafer surface is the basis for the formation of active and passive devices having ever decreasing dimensions.

From a processing standpoint, the key steps in the planar process are: 1) the formation of a masking oxide layer; 2) the selective removal or etching of the oxide layer; 3) the deposition of the dopant atoms on or near the wafer surface; and 4) the diffusion of the dopant atoms into the wafer surface. As described below, many of these steps are performed as "wet" processes, so called because the steps involve immersing the wafer in various acids and other solutions. In addition, there are typically a number of cleaning steps performed between the key steps, with these cleaning steps also being wet processes.

The following discussion focuses on the planar processing of silicon integrated circuits, however, similar processing steps are used for gallium arsenide and other semiconductor materials. Two important advantages of silicon are its good semiconducting properties (i.e., its intrinsic-carrier concentration versus dopant density), and the ability to form on it a stable, controllable silicon dioxide film that has excellent chemical properties. Indeed, the chemical properties of the silicon-silicon dioxide system allow for the selective etching of the silicon and the oxide, and for the doping of specific regions of the silicon. Both of these chemical properties are key to producing dense arrays of semiconductor devices on a single wafer.

The first step in producing silicon integrated circuits is the production of large, high quality silicon crystals. The crystals must also be of very high-purity; typically only about one unintentional, electrically active impurity atom pure billion silicon atoms can be tolerated. The crystals are initially formed from silicon dioxide and carbon in a high temperature (about 2000 degrees Centigrade) electric arc furnace, which produces a metallurgical-grade silicon. This metallurgical-grade silicon is then converted to trichlorosilane which is, in turn, reduced by hydrogen to form high-purity, polysilicon semiconductor-grade silicon.

The semiconductor-grade silicon is then formed into a large, nearly perfect single crystal using either the Czochralski (CZ) method or the float-zone (FZ) method. The CZ method involves melting the polysilicon in a fused-silica crucible in an inert gas atmosphere (such as argon), then inserting a high-quality seed crystal in the melt. The seed is slowly pulled from the melt while rotating, thus producing a large, single crystal ingot of silicon. By contrast, in the FZ method a rod of cast polycrystalline silicon is held in a vertical position and slowly rotated while a melted region is slowly passed from the bottom of the rod to the top.

Once the single silicon crystal has been grown, it is sliced with a diamond saw into thin wafers. Each wafer is then polished and chemically etched until a mirror-like surface is obtained. Marks may also added to the edge of the wafer to indicate the orientation of the crystal structure. After the wafers have been formed and polished, the actual planar process begins.

The first step of the planar process is the growth of an oxide layer of about 20 nanometers to 1 micrometer in thickness on the surface of the wafer. The oxide layer is typically grown either by thermal oxidation or deposition, with thermally grown oxides generally of a higher quality than deposited oxides. In order to maintain the stability of the electrical properties of the interface between the silicon and the oxide, the numbers of organic or metallic on the surface and in the oxide impurities must be kept to a minimum.

The thermal oxide is formed by placing the wafer inside a resistance-heated furnace having a temperature in the range of 850 to 1100 degrees Centigrade. The oxidizing agent can be dry oxygen or it can contain water vapor, with oxidation proceeding more rapidly in the latter environment. Since oxidation takes place at the silicon-silicon dioxide interface, the oxidizing agent must diffuse through any previously formed oxide and then react with the silicon surface. In fact, for lower temperatures and thinner oxides, the oxide thickness is a linear function of the oxidation time. However, at higher temperatures and for thicker oxides, the oxide thickness is proportional to the square root of the oxidation time. This provides a practical upper limit on the thickness of oxides which can be obtained.

After the oxide layer has been formed, the second step of the planar process involves the selective etching of the oxide is performed to expose areas of the silicon where dopant atoms are to be introduced. The selective removal is accomplished using a light-sensitive polymer material called a resist, in a process called photolithography. The oxidized wafer is lightly coated with the liquid resist and then the resist is dried. A partially transparent photomask is then placed on the wafer and aligned using a microscope. The wafer is then exposed to ultraviolet light, which changes the chemical structure of the portions of the resist which are not shielded by the photomask. Finally, the exposed portions of the resist are then selectively dissolved using a solvent such as trichloroethylene.

Note that as the minimum feature size of semiconductor devices approaches the wavelength of the ultraviolet light, diffraction can limit the available resolution when using conventional photoplithography. In order to overcome this limitation, alternatives to conventional photolithography have been developed. Two of these advanced approaches are electron-beam lithography and x-ray lithography, the latter in which the greatest progress has been made to date.

Electron-beam lithography uses a focused stream of electrons to deliver exposure energy to the resist. More particularly, the electron beam is deflected to expose the desired pattern sequentially, so that a mask is not needed. In order to control the deflection, the information needed to deflect the electron beam is stored in a computer. Additionally, the electron beam can be finely focused to a size much smaller than the minimum feature size an moved across the surface of the wafer, or the beam can be formed into a rectangular shape and the pattern built up by repeated block-like exposures.

After the photomask pattern has been formed in the resist, the unprotected portions of the oxide are chemically etched to transfer the pattern to the silicon wafer. The chemical etching may be accomplished by dissolving the unprotected portions of the oxide using hydrofluoric acid, resulting in the exposure of corresponding portions of the silicon wafer. The resist is then removed from the remaining portions of the oxide by "ashing", in which the resist is burned off in a plasma chamber under vacuum.

Once the remaining portions of the resist have been removed, the dopant atoms are added to the exposed portions of the silicon wafer. The resulting dopant profile, or distribution of dopant atoms, is primarily determined by steps three and four of the planar process. In step three, the dopant atoms are placed on or near the surface of the wafer by liquid coating, ion implantation or gaseous deposition. The fourth step involves transporting the dopant atoms into the wafer using a process called drive-in diffusion. Note that the shape of the resulting dopant distribution is determined by the method of dopant placement, while the diffusion depth depends primarily on the temperature and time of the drive-in diffusion.

A major concern throughout the planar fabrication process is in eliminating contamination. Specifically, the current goal of modem integrated circuit processing is to produce wafers having less than four particles of contamination per wafer, with each particle being less than 0.5 micron in diameter. Of particular concern is the fine organic ash that remains on the wafer surface following conventional or electron-beam photolithography and ashing.

Following the lithography and ashing steps, the wafer is cleaned using the following conventional cleaning process. First, a hot sulfuric acid/hydrogen peroxide wash is used to remove organic contamination. The hot sulfuric acid/hydrogen peroxide wash is followed by an ammonium hydroxide/hydrogen peroxide rinse to remove non-metallic particles, and then a hydrochloric acid/hydrogen peroxide rinse to remove any metallic particles introduced by the high ph (approximately 12) of the ammonium hydroxide/hydrogen peroxide rinse.

In the conventional cleaning process, the hot sulfuric acid/hydrogen peroxide wash is performed at a temperature of between 120 and 160 degrees Centigrade in a special quartz vessel. However, quartz is extremely fragile and is subject to very high internal stress during fabrication which limits its service life, particularly under ultrasonic vibration. Yet ultrasonic vibration may be required to completely remove the contamination remaining on the wafer surface following ashing. Additionally, the inner surface of the quartz vessel may contain its own organic film which can find its way into the acid and eventually onto the wafers. Thus, the time required to remove these contaminants, coupled with the high cost and limited service life of the vessel, are important limiting factors in the throughput of the planar process.

Accordingly, there is a need for a method and apparatus for cleaning wafers during the production of integrated circuits which does not require the use of an expensive and fragile quartz vessel, which uses reduced concentrations of cleaning solvents, and in which ultrasonic vibrations are used to improve the efficiency and increase the throughput of the cleaning process.

SUMMARY OF THE INVENTION

The present invention provides a method and apparatus for removing particle, metallic and organic contamination from the semiconductor wafers used in fabricating integrated circuits. The method and apparatus of the present invention may be used in the processing all types of semiconductor wafers, including silicon ,-red gallium arsenide wafers.

In a preferred embodiment, the method of the invention involves placing the wafers to be cleaned in a vessel or container constructed of a pure, nonreactive material upon which a surface oxide will quickly form in air. One example of this type of material is the metal tantalum, which can be refined to be 99.995 percent pure and whose surface oxide is thermodynamically stable, malleable and forms within a few milliseconds of exposure of the surface to air. In addition, the surface oxide of tantalum can resist corrosion in an acidic environment at least as well as conventional quartz vessels, and is substantially more pure than the surface of conventional quartz vessels.

The nonreactive vessel or container is then filled with an acidic cleaning solution such as sulfuric acid/hydrogen peroxide or hydrochloric acid/hydrogen peroxide, and the solution is ultrasonically vibrated to remove the contamination. Specifically, the ultrasonic vibration causes an acoustic streaming of the cleaning solution, which induces a microflow of the solvent across the surface of the wafer at speeds on the order of several meters per second. This induced microflow provides for an quick and efficient cleaning of the wafer at reduced temperatures, thereby increasing the overall throughput of the planar fabrication process. Note that the corrosive resistance and purity of the surface oxide will prevent contamination of the acidic cleaning solution by the nonreactive vessel or container.

The present invention also comprises an apparatus for cleaning integrated circuit wafers comprising a vessel or container constructed from a nonreactive material. Contained within the nonreactive vessel or container is an acidic cleaning solution, such as sulfuric acid/hydrogen peroxide or hydrochloric acid/hydrogen peroxide. Attached to the vessel or container are one or more ultrasonic transducers which are, in turn, coupled to an ultrasonic generator for vibrating the acidic cleaning solution at ultrasonic frequencies. In addition, a hot acid pump and filtering system are attached to the container for removing particles of contamination from the acidic cleaning solution. Finally, a heating system is attached to the vessel or container for heating the acidic cleaning solution.

Further features and advantages of the present invention will be appreciated by a review of the following detailed description of the preferred embodiments taken in conjunction with the following drawings.

BRIEF DESCRIPTION OF THE DRAWINGS

The present invention may be best understood by referring to the following detailed description of the preferred embodiments and the accompanying drawings, wherein like numerals denote like elements and in which:

FIG. 6 illustrates an apparatus constructed in accordance with the present invention for removing particle, metallic and organic contamination from integrated circuit wafers during the silicon planar process.

DETAILED DESCRIPTION OF THE PREFERRED EMBODIMENTS

The following exemplary discussion focuses on the planar processing of silicon integrated circuits, with emphasis on the control and elimination of contaminants during each processing step. Indeed, a substantial portion of the total processing time and effort is directed to steps and procedures for cleaning, purifying or otherwise eliminating contamination. More importantly, as the physical size and packing density of individual semiconductor devices becomes smaller, the need to control and eliminate contaminates during fabrication increases.

The first step in producing silicon integrated circuits is the production of large, high quality silicon crystals. The crystals must also be of very high-purity. For example, a typical semiconductor-grade crystal averages only about one unintentional, electrically active impurity atom pure billion silicon atoms. High-purity silicon is produced from silicon dioxide and elemental carbon in a high temperature (about 2000 degrees Centigrade) electric arc furnace, where the carbon reduces the silicon dioxide to elemental silicon. The elemental silicon then condenses to about 90 percent pure, metallurgical-grade silicon. This metallurgical-grade silicon is then converted to trichlorosilane which is, in turn, purified by distillation. Finally, the purified trichlorosilane is reduced by hydrogen to form high-purity, polysilicon semiconductor-grade silicon 103 (see FIGS. 1(a)–1(b)).

Figure 1A:
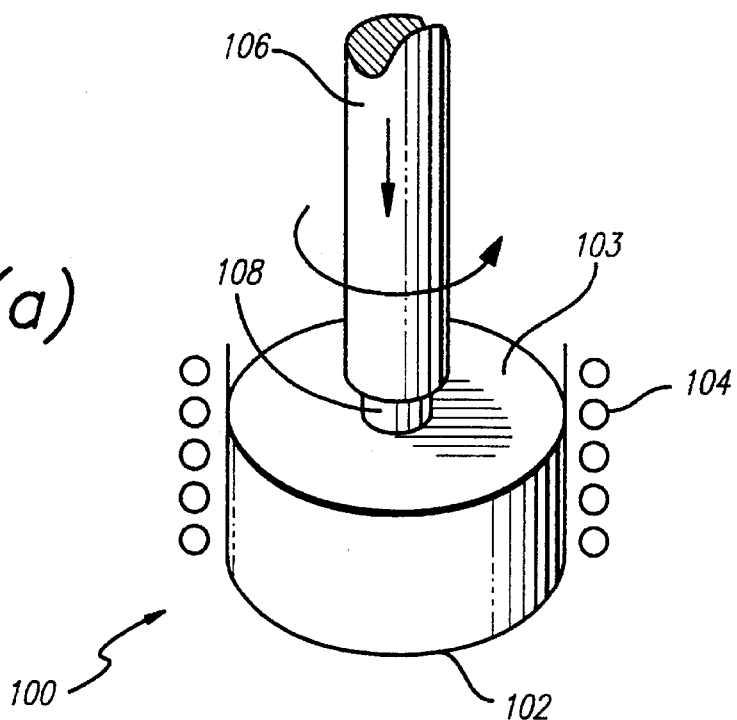
FIGS. 1(a) and 1(b) illustrate a conventional apparatus for producing single-crystal semiconductor ingots using the CZ method.
Figure 1B:
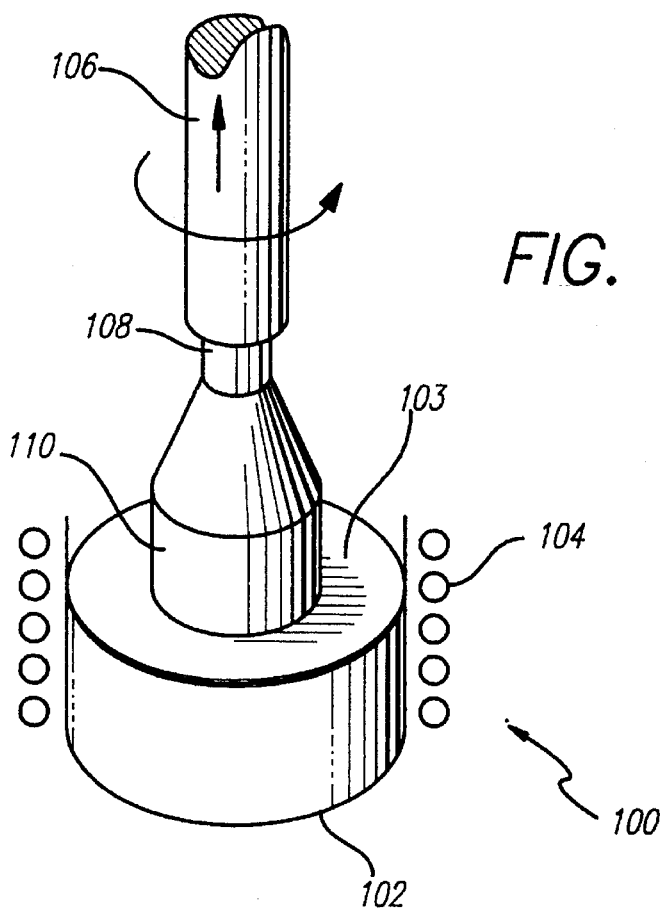

The polysilicon semiconductor-grade silicon 103 is then formed into a large, nearly perfect single crystal ingot using either the Czochralski (CZ) method or the float-zone (FZ) method. Referring to FIGS. 1(a) and 1(b), an apparatus 100 for producing single-crystal semiconductor ingots using the CZ method is shown. As shown in FIGS. 1(a) and 1(b), apparatus 100 includes a fused-silica crucible 102 surrounded by heating coils 104, the latter which are used to hold crucible 102 at a temperature of just above 1412 degrees Centigrade. A rotating support member 106 is used to hold a high-quality seed crystal 108 which a desired crystalline orientation, and to lower and raise seed crystal 108 to and from crucible 102.

The CZ method involves melting the semiconductor-grade silicon 103 in crucible 102 under an inert gas atmosphere (such as argon); then lowering seed crystal 108 in the melt using rotating support member 106. Seed crystal 108 is then is slowly pulled from the melt continuing the rotation, thus producing a large, single crystal ingot of silicon 110. By carefully controlling the growth conditions, new silicon atoms are added to ingot 110 in a manner which continues the crystal structure of seed crystal 108. Additionally, a desired diameter for ingot 110 is obtained by feedback control of the pull rate and temperature of the melt.

Figure 2:
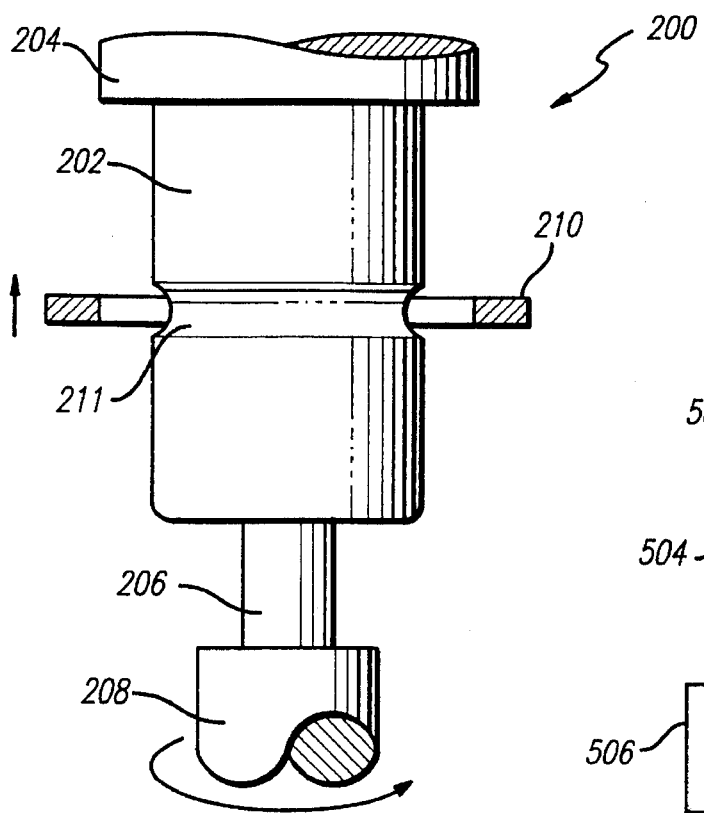
FIG. 2 illustrates a conventional apparatus for producing a single crystal ingot using the FZ method.

Continuing with FIG. 2, an apparatus 200 for producing a single crystal ingot using the FZ method is shown in the FZ method a rod of cast polycrystalline silicon 202 is held in a vertical position by a first holder 204 and slowly rotated. A seed crystal 206 is placed in contact with the bottom of rod 202 and is hold in place by second holder 208. A radio-frequency induction heating coil 210 is slowly passed from seed crystal 206 along rod 202 from bottom to top. This causes a melted zone 211 to start at seed crystal 206 and to move along rod 202, which produces a purified and uniform crystal structure.

Once a single crystal ingot has been grown using either the CZ or FZ method, it is sliced into thin wafers using a diamond blade saw. Each wafer is then polished and chemically etched until a mirror-like surface is obtained. Identification marks may also added to the edge of each wafer to indicate the orientation of the crystal structure. After all of the wafers have been formed and polished, the actual planar fabrication process begins.

Figure 3:
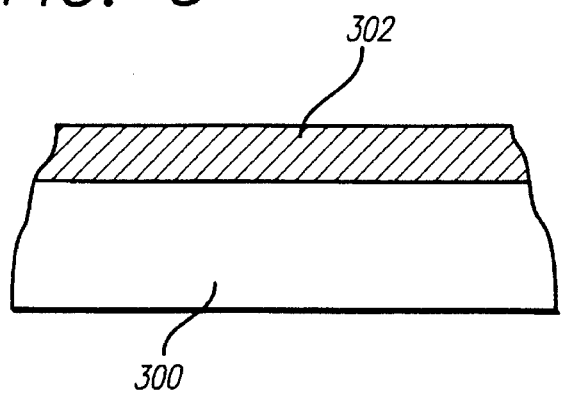
FIG. 3 shows a heavily doped p-type substrate wafer upon which a lightly doped n-type epitaxial layer 302 has been grown.

Referring now to FIGS. 3 and 4(a)–4(j), the steps for constructing an exemplary n-channel junction field-effect transistor (JFET) using the silicon planar process are now discussed. Referring first to FIG. 3, construction of the JFET begins with obtaining a heavily doped p-type substrate wafer 300, upon which a lightly doped n-type epitaxial layer 302 is grown. To grow epitaxial layer 302, substrate wafer 300 is placed in a chamber which is heated to a temperature of 900 to 1250 degrees Centigrade. A gas such as silane or silicon tetrachloride is passed over the surface of substrate wafer 300, and the gas decomposes on the surface of wafer 300 thereby depositing a layer of silicon. More particularly, the depositing silicon atoms form covalent bonds with the substrate atoms and thus extend the single-crystal lattice of substrate wafer 300 to form epitaxial layer 302. An n-type dopant-containing gas such as phosphine is simultaneously introduced into the chamber for adding n-type dopant atoms to epitaxial layer 302.

Figure 4A:
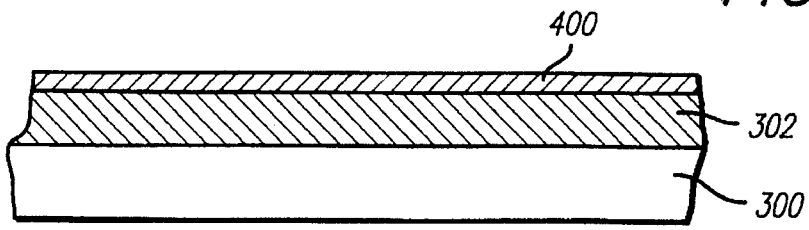
FIGS. 4(a), 4(b), 4(c), 4(d), 4(e), 4(f), 4(g), 4(h) and 4(j) are a sequence of diagrams illustrating the construction of an n-channel junction field-effect transistor (JFET) using the conventional silicon planar process.

Continuing with FIG. 4(a), the first step of the planar process is the growth of a first oxide layer 400 of about 20 nanometers to 1 micrometer in thickness on the surface of epitaxial layer 302. Oxide layer 400 may be grown either by thermal oxidation or deposition, with thermally grown oxides generally of a higher quality than deposited oxides. In order to maintain the stability of the electrical properties of the interface between epitaxial layer 302 and oxide layer 400, the numbers of organic or metallic impurities on the surface of epitaxial layer 302 and in oxide layer 400 must be kept to a minimum.

Oxide layer 400 is formed by placing substrate wafer 300 inside a resistance-heated furnace having a temperature in the range of 850 to 1100 degrees Centigrade. The oxidizing agent can be dry oxygen or it can contain water vapor, with oxidation proceeding more rapidly in the latter environment. Since oxidation takes place at the silicon-silicon dioxide interface, the oxidizing agent must diffuse through any previously formed oxide and then react with the silicon surface. In fact, for lower temperatures and thinner oxides, the oxide thickness is a linear function of the oxidation time. However, at higher temperatures and for thicker oxides, the oxide thickness is proportional to the square root of the oxidation time.

Figure 4B:
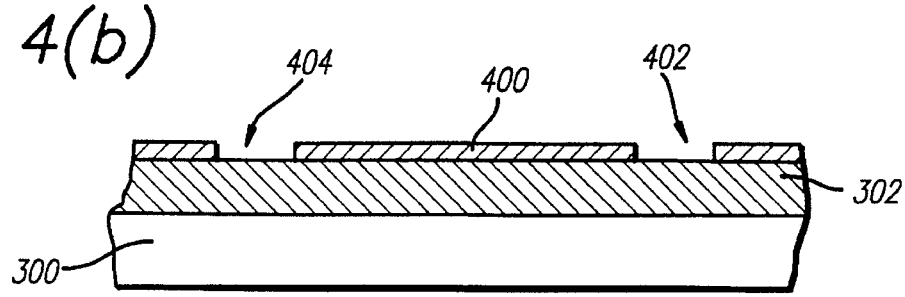

Referring now to FIG. 4(b), after oxide layer 400 has been formed on the surface of epitaxial layer 302, selective etching of oxide layer 400 is performed to create openings 402 and 404. The selective etching is accomplished using a light-sensitive polymer material called a resist, in a process called photolithography. Specifically, oxide layer 400 is lightly coated with a liquid resist (not shown) and then the resist is dried. A first photomask (not shown) is then placed on the resist and aligned using a microscope. The first photomask and resist are then exposed to ultraviolet light, which changes the chemical structure of the portions of the resist which are not shielded by the photomask. Finally, the exposed portions of the resist are then selectively dissolved using a solvent such as trichloroethylene.

Continuing with FIG. 4(b), after the photomask pattern has been formed in the resist, the unprotected portions of the oxide layer 400 are chemically etched to transfer the pattern to form openings 402 and 404. The chemical etching may be accomplished by dissolving the unprotected portions of oxide layer 400 using hydrofluoric acid, resulting in the exposure of corresponding portions of epitaxial layer 302. The resist is then removed from the remaining portions of oxide layer 400 by "ashing", in which the resist is burned off in a plasma chamber under vacuum.

Figure 4C:
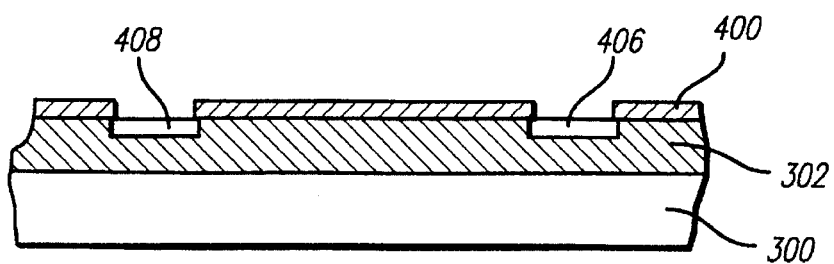

Referring to FIG. 4(c), once the remaining portions of the resist have been removed, n-type dopant atoms are added to the exposed portions of epitaxial layer 302, to form n-type regions 406 and 408. The dopant profile of regions 406 and 408 is primarily determined by steps three and four of the planar process. In step three, the dopant atoms are placed on or near the surface of epitaxial layer 302 by liquid coming, ion implantation or gaseous deposition. The fourth step involves transporting the dopant atoms into epitaxial layer 302 using a process called drive-in diffusion. Note that the shape of the resulting dopant distribution is determined by the method of dopant placement, while the diffusion depth depends primarily on the temperature and time of the drive-in diffusion.

Figure 4D:
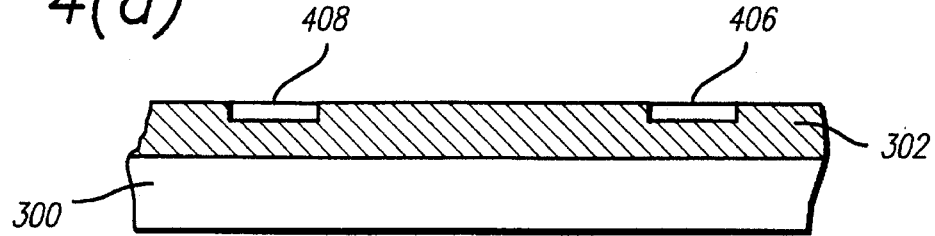
Figure 4E:
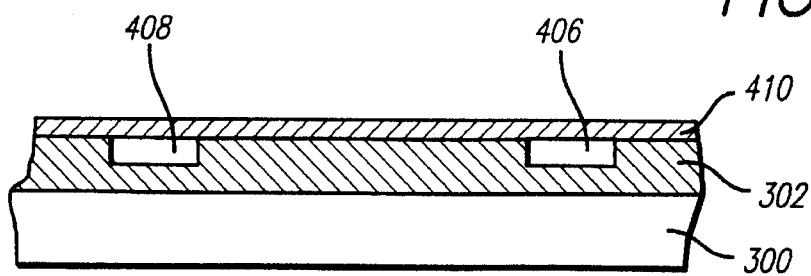

After regions 406 and 408 have been formed in epitaxial layer 302, oxide layer 400 is chemically removed by etching with hydrofluoric acid, as shown in FIG. 4(d). Next, a second oxide layer 410 is formed by again placing substrate wafer 300 inside a resistance-heated furnace having a temperature in the range of 850 to 1100 degrees Centigrade. As before, the oxidizing agent can be dry oxygen or it can contain water vapor, with oxidation proceeding more rapidly in the latter environment.

Figure 4F:
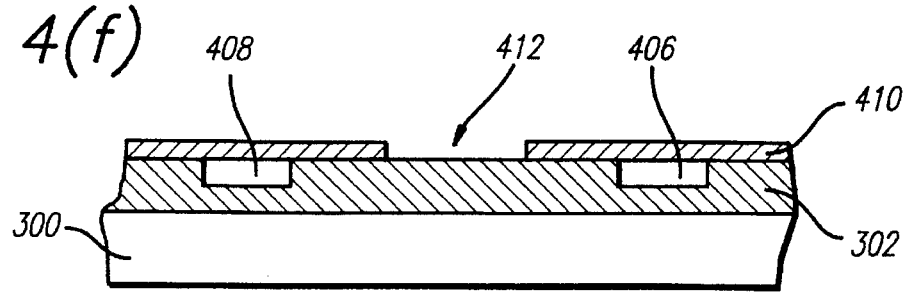
Figure 4G:
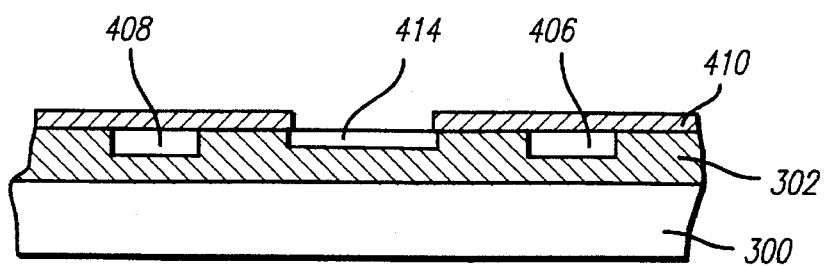

Referring now to FIGS. 4(f), once oxide layer 410 has been formed on the surface of epitaxial layer 302, selective etching is performed to create opening 412. As described in connection with the etching of oxide layer 400, oxide layer 410 is lightly coated with a liquid resist (not shown) and then the resist is dried. A second photomask (not shown) is then placed on the resist and aligned using a microscope. The second photomask and resist are then exposed to ultraviolet light, which changes the chemical structure of the portions of the resist which are not shielded by the photomask. Finally, the exposed portions of the resist are then selectively dissolved using a solvent such as trichloroethylene.

Continuing with FIG. 4(f), after the photomask pattern has been formed in the resist, the unprotected portion of oxide layer 410 is chemically etched to transfer the pattern to form opening 412. The chemical etching may be accomplished by dissolving the unprotected portions of oxide layer 410 using hydrofluoric acid, resulting in the exposure of the underlying portion of epitaxial layer 302. The resist is then removed from the remaining portions of oxide layer 410, again by ashing under vacuum Referring now to FIG. 4(g), once the remaining portions of the resist have been removed, p-type dopant atoms are added to the exposed portion of epitaxial layer 302, to form an p-type region 414. As described above, the shape of the resulting dopant distribution is determined by the method of dopant placement, while the diffusion depth depends primarily on the temperature and time of the drive-in diffusion. Note also that the shapes of the dopant distributions for n-type regions 406 and 408 are also changed during this process.

Figure 4H:
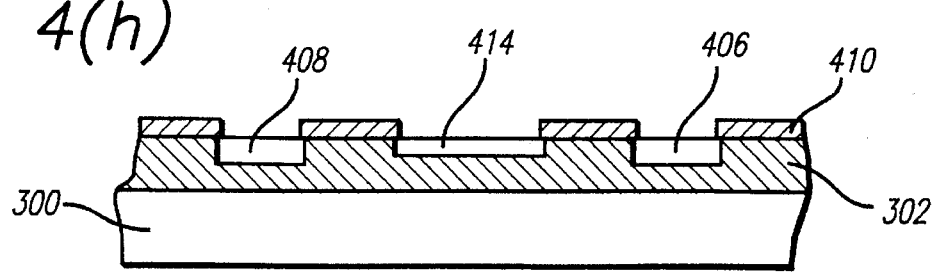

Referring now to FIG. 4(h), once p-type region 414 has been formed on the surface of epitaxial layer 302, selective etching is performed to re-expose heavily-doped n-type regions 406 and 408. Once again, oxide layer 410 is lightly coated with a liquid resist (not shown) and then the resist is dried. A third photomask (not shown) is then placed on the resist and aligned using a microscope. The third photomask and resist are then exposed to ultraviolet light, which changes the chemical structure of the portions of the resist which are not shielded by the photomask. The exposed portions of the resist are then selectively dissolved using trichloroethylene.

After the photomask pattern has been formed in the resist, the unprotected portions of oxide layer 410 are chemically etched to transfer the pattern to expose regions 406 and 408. The chemical etching may be accomplished by dissolving the unprotected portions of oxide layer 410 using hydrofluoric acid, resulting in the exposure of the underlying portion of epitaxial layer 302. The resist is again removed from the remaining portions of oxide layer 410, once again by ashing under vacuum.

Figure 4I:
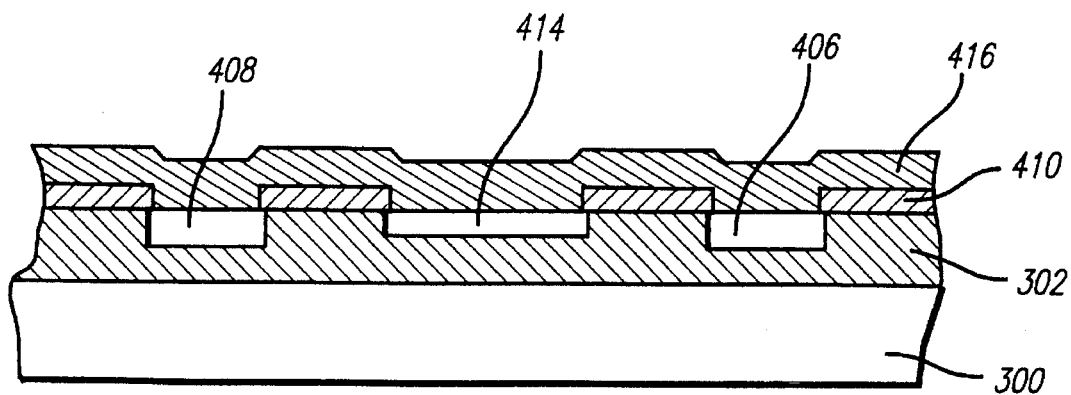
Figure 4J:
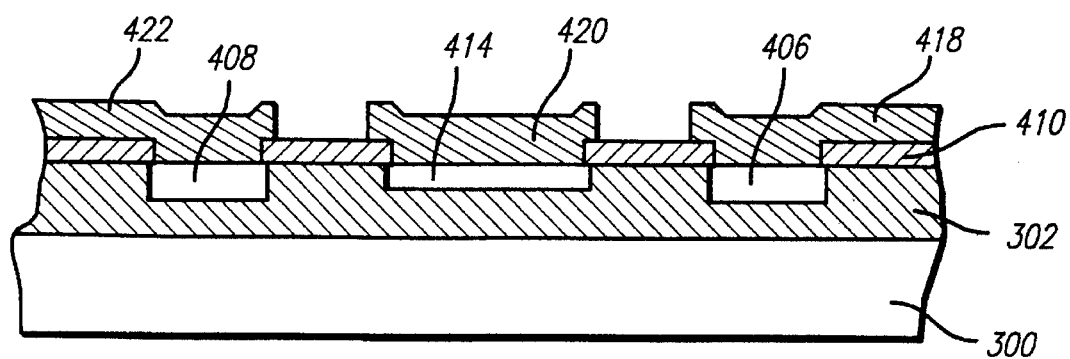

Continuing with FIG. 4(i), after oxide layer 410 has been chemically etched to expose regions 406 and 408, a metal layer 416 is deposited over the surface of oxide 410 and regions 406, 408 and 414. The deposition of metal layer 416 is performed by sputtering in a low pressure chamber. Referring to FIG. 4(j), metal layer 416, which usually consists of aluminum or an aluminum alloy, is then removed from areas where it is not desired by photolithography and etching operations similar to those already described.

As an alternative to the above-described photlithography steps which uses ultraviolet light, electron-beam lithography may be used which focuses a stream of electrons to deliver exposure energy to the resist. More particularly, the electron beam is deflected to expose the desired pattern sequentially, so that a mask is not needed. In order to control the deflection, the information needed to deflect the electron beam is stored in a computer. Additionally, the electron beam can be finely focused to a size much smaller than the minimum feature size an moved across the surface of the wafer, or the beam can be formed into a rectangular shape and the pattern built up by repeated block-like exposures.

A key concern throughout the above fabrication process is in eliminating contamination. Indeed, most of the fabrication steps described above are performed in a "clean room" environment in which the number of airborne contaminants are carefully controlled and measured in terms of parts per million (PPM). However, an important source of contamination are the materials and by-products used during the fabrication process, particularly during the conventional or electron-beam photolithography steps, which cannot be controlled using only clean room techniques.

The fabrication of modem very large scale integrated (VLSI) circuits often requires 10 to 25 photolithography steps similar to those described above. Between each of these steps, the photoresist must be completely removed, otherwise, it will contaminate the next fabrication step. However, the ashing step that is used to remove the photoresist after etching leaves a very small amount of residue or ash on the surface of the wafer. The residue or ash can become a source of organic contamination during the next fabrication step.

A particular problem arises when using electron-beam lithography. The energy levels present in the electron beam will decompose chemical structure of the resist, making it very difficult to remove using only chemical processes. Ashing is again used to remove the decomposed resist, however, the organic residue will remain and may contaminate the next fabrication step.

Figure 5:
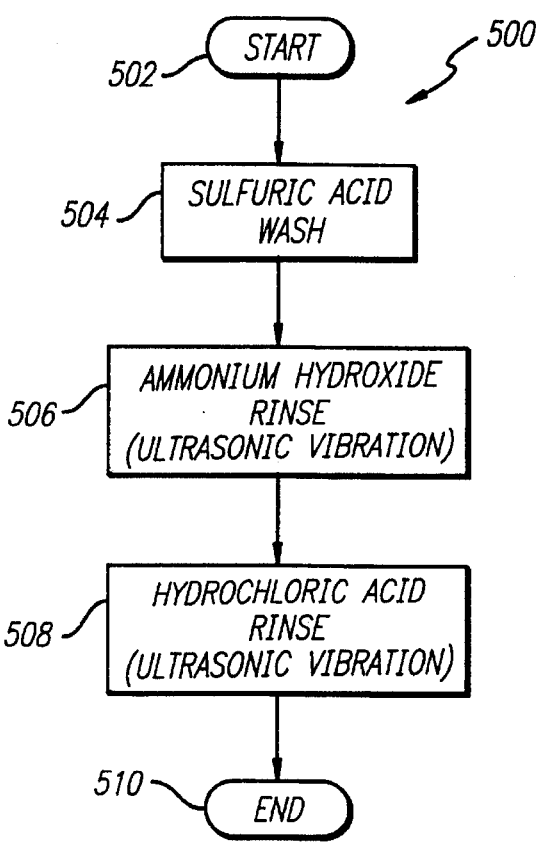
FIG. 5 is a flow chart illustrating the steps of a conventional substrate cleaning process for removing contaminants from an integrated circuit wafer during the silicon planar process.

In order to control this type of organic contamination, after photolithography and ashing the wafer being fabricated is cleaned using the conventional cleaning process 500 shown in FIG. 5. Process 500 begins at step 502 after which a hot sulfuric acid/hydrogen peroxide wash is used to remove organic contamination (e.g., the photoresist residue) in step 504. The hot sulfuric acid/hydrogen peroxide wash is followed by an ammonium hydroxide/hydrogen peroxide rinse in step 506 to remove non-metallic and organic particles, and then a hydrochloric acid/hydrogen peroxide rinse in step 508 is used to remove any metallic particles introduced by the high ph (approximately 12) of the ammonium hydroxide/hydrogen peroxide rinse. Process 500 ends at step 510.

In conventional cleaning process 500, the hot sulfuric acid/hydrogen peroxide wash is performed at a temperature of between 120 and 160 degrees Centigrade in a special quartz vessel. However, quartz is extremely fragile and is subject to very high internal stress during fabrication, particularly under ultrasonic vibration. Yet ultrasonic vibration may be required to completely remove the contamination remaining on the wafer surface following ashing. Additionally, the inner surface of the quartz vessel may contain an organic film which can find its way into the acid and eventually onto the wafers. The time required to remove this organic film, coupled with the high cost and limited service life of the vessel, are important limiting factors in the overall throughput of the fabrication process.

Referring now to FIG. 6, an apparatus 600 constructed in accordance with the present invention for removing particle, metallic and organic contamination from the wafers during fabrication, is shown. In the preferred embodiment, apparatus 600 comprises a vessel or container 602 constructed from a very pure, nonreactive material. An example of this type of metal is tantalum, which can be refined to better than 99.995 percent purity and whose surface oxide is thermodynamically stable, malleable and can resist corrosion in a strongly acidic environment. Although not critical to the function of apparatus 600, in the preferred embodiment metal vessel or container 602 is cylindrical in shape and has a volume capacity of 15 to 35 liters.

Contained within vessel or container 602 is an acidic cleaning solution 604, such as sulfuric acid/hydrogen peroxide or hydrochloric acid/hydrogen peroxide. More particularly, vessel or container 602 is filled with cleaning solution 604 to a level 603 which is just above the top edge 601 of vessel or container 602. A catch basin 605 which is also constructed from the same non-reactive metal is attached to the top of vessel or container 602, as shown.

Continuing with FIG. 6, attached to the bottom of vessel or container 602 are ultrasonic transducers 606 and 608 which are, in turn, coupled to an ultrasonic generator 610 via signal path 611. Ultrasonic generator 610 generates an electronic signal for vibrating acidic cleaning solution 604 at ultrasonic frequencies. Ultrasonic generator 610 also includes a frequency modulation capability which modulates the ultrasonic electronic signal, thereby preventing the formation of standing waves standing waves within vessel or container 602. Such a standing wave could result in stress type damage to the wafers 624 which are being cleaned.

For removing particles of contamination from cleaning solution 604, a hot acid pump and filtering system 612 comprising a Teflon pump 614, an acid filter 616 and connecting tubes 618–622 are attached to vessel or container 602. More particularly, the input of acid filter 616 is connected to the bottom of catch basin 605 using connecting tube 618. The output of acid filter 616 is connected to the input of Teflon pump 614 using connecting tube 620, with the output of Teflon pump 614 connected to the bottom of vessel or container 602 using connecting tube 620.

Finally, a heating system (not shown) is attached to vessel or container 602 for heating the acidic cleaning solution 604 to a temperature of 100 to 160 degrees Centigrade.

Apparatus 600 may be operated as follows. First, cleaning solution 604 is heated to a temperature of between 100 and 160 degrees Centigrade Next, the wafers 624 to be cleaned are placed in a crystal supporting boat 626 which is then submerged in cleaning solution 604. Ultrasonic generator 610 is set to generate a signal having an ultrasonic frequency of about 40 kilohertz, with a modulation frequency of two kilohertz. The signal causes ultrasonic transducers to undergo a mechanical vibration of about 40 kilohertz, which cause a similar vibration to occur in cleaning solution 604. More importantly, the vibration of cleaning solution 604 causes acoustic streaming in direction 628 which, in turn, induces a microflow across the surface of wafers 624 at speeds on the order of several meters per second. This induced microflow removes any particles attached to wafers 624 and carries the particles to fluid surface 603, where the particles continue to move in directions 632 and 634 toward catch basin 605.

Once the fluid containing the particles has been transported to catch basin 605, it is removed via connecting tube 618 to filter 616. Filter 616, which has a screen size of about one micron, removes the particles and transports the filtered fluid to Teflon pump 614 via connecting tube 620. Teflon pump 614 then pumps the filtered fluid back to vessel or container 602 via connecting tube 622.

An important advantage of the present invention is that the use of ultrasonic vibration in combination with certain acidic cleaning solutions can be used to remove the photoresist which remains after electron-beam lithography, without the need for ashing. More particularly, the acoustic streaming and induced microflow across the surface of the wafers will have sufficient kinetic energy to remove all of the decomposed resist, thereby eliminating the need for the ashing step. Thus, after each photolithography or electron-beam lithography step, apparatus 600 can be used to directly remove the resist. The elimination of the ashing step and replacement of conventional cleaning process 500 with the method and apparatus of the present invention will reduce the cost and increase the overall throughput of the planar fabrication process.

The foregoing description includes what are at present considered to be preferred embodiments of the invention. However, it will be readily apparent to those skilled in the art that various changes and modifications may be made to the embodiments without departing from the spirit and scope of the invention. For example, other metals may be used to construct the metal vessel or container and other types of cleaning solutions may be used. Accordingly, it is intended such changes and modifications fall within the spirit and scope of the invention, and that the invention be limited only by the following claims.

What is claimed is:

1. An apparatus for cleaning a semiconductor substrate, said semiconductor substrate having a planar surface portion upon which plural semiconductor devices are formed, and said cleaning including removal of particles of contamination from said planar surface portion of said semiconductor substrate, said apparatus comprising:

a metal container constructed of a metal having acid resisting properties;

an acidic cleaning solution disposed within said metal container, said acidic cleaning solution containing a concentration of acid of less than ninety eight percent; and an ultrasonic vibrating device coupled to said metal container, said ultrasonic vibrating device for vibrating said metal container at an ultrasonic frequency to cause an acoustic streaming of said acidic cleaning solution, said acoustic streaming inducing a microflow of said acidic solution across said planar surface portion of said semiconductor substrate, and said microflow of said acidic solution causing said particles of contamination to transported from said planar surface of said semiconductor substrate to said acidic solution, thereby removing said particles of contamination from said planar surface of said semiconductor substrate.

2. The apparatus of claim 1 wherein said metal container comprises one or more side portions and a bottom portion, said one or more side portions connected to said bottom portion so that said metal container has an open top.

3. The apparatus of claim 2 wherein said metal container further comprises an overflow basin attached adjacent to said open top, said overflow basin for catching and holding any of said acidic solution which overflows from said open top of said metal container.

4. The apparatus of claim 3 wherein said metal container is constructed from tantalum.

5. The apparatus of claim 3 further comprising a filtering device for removing said particles of contamination from said acidic solution.

6. The apparatus of claim 5 wherein said filtering device further comprises a filter and a Teflon pump, said filter for removing said particles of contamination from said acidic solution, and said Teflon pump connected between said metal container and said filter for pumping said acidic solution to and from said metal container and said filter.

7. The apparatus of claim 6 wherein said filtering device further comprises a first fluid conductor for coupling said overflow basin of said metal container to said filter, a second fluid conductor for coupling said filter to said Teflon pump, and a third fluid conductor for coupling said Teflon pump to said bottom portion of said metal container.

8. The apparatus of claim 7 wherein said ultrasonic vibrating device further comprises an ultrasonic signal generator connected to one or more ultrasonic transducers, said ultrasonic generator for generating an electrical signal having an ultrasonic frequency, and said one or more ultrasonic transducers attached to said metal container for converting said electrical signal having said ultrasonic frequency to a mechanical vibration having a corresponding ultrasonic frequency, said mechanical vibration for vibrating said metal container at said corresponding ultrasonic frequency.

9. The apparatus of claim 8 wherein said one or more ultrasonic transducers are attached to said bottom portion of said metal container thereby causing said acoustic streaming of said acidic solution from said bottom portion of said container to said open top of said container.

10. The apparatus of claim 1 wherein said acidic solution further comprises sulfuric acid and hydrogen peroxide.

11. The apparatus of claim 1 wherein said acidic solution further comprises a solution of hydrochloric acid and hydrogen peroxide.

12. A method for cleaning a semiconductor substrate, said semiconductor substrate having a planar surface portion upon which plural semiconductor devices are formed, and said cleaning including removal of particles of contamination from said planar surface portion of said semiconductor substrate, said method comprising the steps of:

placing said semiconductor substrate in a metal container constructed of a metal having acid resisting properties;

filling said metal container with an acidic cleaning solution, said acidic cleaning solution containing a concentration of acid of less than ninety eight percent; and vibrating said metal container at an ultrasonic frequency using an ultrasonic vibrating device coupled to said metal container, said ultrasonic vibrating device for vibrating for causing an acoustic streaming of said acidic cleaning solution, said acoustic streaming for inducing a microflow of said acidic solution across said planar surface portion of said semiconductor substrate, and said microflow of said acidic solution for causing said particles of contamination to transported from said planar surface of said semiconductor substrate to said acidic solution, thereby removing said particles of contamination from said planar surface of said semiconductor substrate.

13. The method of claim 12 further comprising the step of filtering said acidic solution in order to remove said particles of contamination from said acidic solution.

14. The method of claim 13 wherein said step of filtering said acidic solution further comprises the step of using a filter and a Teflon pump, said filter for removing said particles of contamination from said acidic solution, and said Teflon pump connected between said metal container and said filter for pumping said acidic solution to and from said metal container and said filter.

15. The method of claim 12 wherein said step of vibrating said metal container at said ultrasonic frequency further comprises the step of using an ultrasonic signal generator connected to one or more ultrasonic transducers, said ultrasonic generator for generating an electrical signal having an ultrasonic frequency, and said one or more ultrasonic transducers attached to said metal container for converting said electrical signal having said ultrasonic frequency to a mechanical vibration having a corresponding ultrasonic frequency, said mechanical vibration for vibrating said metal container at said corresponding ultrasonic frequency.

16. The method of claim 15 wherein said the step of using an ultrasonic signal generator connected to one or more ultrasonic transducers further comprises the step of attaching said one or more ultrasonic transducers to a bottom portion of said metal container thereby causing said acoustic streaming of said acidic solution from said bottom portion of said container to said open top of said container.

17. A method for cleaning a semiconductor substrate, said semiconductor substrate having a planar surface portion upon which plural semiconductor devices are produced by performing the steps of forming an oxide layer on said planar surface portion of said semiconductor substrate, selectively etching said oxide layer to form one or more openings in said oxide layer, said one or more openings for exposing corresponding portions of said planar surface, depositing dopant atoms on said one or more exposed portions of said planar surface, and diffusing said dopant atoms into said exposed portions of said planar surface, said cleaning including removal of particles of contamination from said planar surface portion of said semiconductor substrate, said method comprising the steps of:

placing said semiconductor substrate in a metal container constructed of a metal having acid resisting properties;

filling said metal container with an acidic cleaning solution, said acidic cleaning solution containing a concentration of acid of less than ninety eight percent; and vibrating said metal container at an ultrasonic frequency using an ultrasonic vibrating device coupled to said metal container, said ultrasonic vibrating device for vibrating for causing an acoustic streaming of said acidic cleaning solution, said acoustic streaming for inducing a microflow of said acidic solution across said planar surface portion of said semiconductor substrate, and said microflow of said acidic solution for causing said particles of contamination to transported from said planar surface of said semiconductor substrate to said acidic solution, thereby removing said particles of contamination from said planar surface of said semiconductor substrate.

18. The method of claim 17 further comprising the step of filtering said acidic solution in order to remove said particles of contamination from said acidic solution.

19. The method of claim 18 wherein said step of filtering said acidic solution further comprises the step of using a filter and a Teflon pump, said filter for removing said particles of contamination from said acidic solution, and said Teflon pump connected between said metal container and said filter for pumping said acidic solution to and from said metal container and said filter.

20. The method of claim 17 wherein said step of vibrating said metal container at said ultrasonic frequency further comprises the step of using an ultrasonic signal generator connected to one or more ultrasonic transducers, said ultrasonic generator for generating an electrical signal having an ultrasonic frequency, and said one or more ultrasonic transducers attached to said metal container for convening said electrical signal having said ultrasonic frequency to a mechanical vibration having a corresponding ultrasonic frequency, said mechanical vibration for vibrating said metal container at said corresponding ultrasonic frequency.

21. The method of claim 20 wherein said the step of using an ultrasonic signal generator connected to one or more ultrasonic transducers further comprises the step of attaching said one or more ultrasonic transducers to a bottom portion of said metal container thereby causing said acoustic streaming of said acidic solution from said bottom portion of said container to said open top of said container.

* * * * *